United States Patent
Vurpillot et al.

(10) Patent No.: US 11,791,129 B2
(45) Date of Patent: Oct. 17, 2023

(54) AUTOMATED TOMOGRAPHY FIELD ION MICROSCOPE

(71) Applicants: Centre National De La Recherche Scientifique, Paris (FR); Institut National Des Sciences Appliquees De Rouen (INSA), Saint Etienne du Rouvray (FR); Universite De Rouen Normandie, Mont Saint Aignan (FR)

(72) Inventors: François Vurpillot, Le Grand Quevilly (FR); Rodrigue Larde, Sainte Croix sur Buchy (FR); Benjamin Klaes, Rouen (FR); Gérald Da Costa, Le Grand Quevilly (FR)

(73) Assignees: CENTRE NATIONAL DE LA RECHERCHE SCIENTIFIQUE, Paris (FR); INSTITUT NATIONAL DES SCIENCES APPLIQUEES DE ROUEN (INSA), Saint Etienne du Rouvray (FR); UNIVERSITE DE ROUEN NORMANDIE, Mont Saint Aignan (FR)

( * ) Notice: Subject to any disclaimer, the term of this patent is extended or adjusted under 35 U.S.C. 154(b) by 224 days.

(21) Appl. No.: 17/435,247

(22) PCT Filed: Feb. 20, 2020

(86) PCT No.: PCT/EP2020/054508
§ 371 (c)(1),
(2) Date: Aug. 31, 2021

(87) PCT Pub. No.: WO2020/178038
PCT Pub. Date: Sep. 10, 2020

(65) Prior Publication Data
US 2022/0139666 A1 May 5, 2022

(30) Foreign Application Priority Data
Mar. 1, 2019 (FR) .................................. 1902139

(51) Int. Cl.
*H01J 37/26* (2006.01)
*H01J 37/285* (2006.01)

(52) U.S. Cl.
CPC .......... *H01J 37/265* (2013.01); *H01J 37/285* (2013.01); *H01J 2237/2626* (2013.01); *H01J 2237/2852* (2013.01)

(58) Field of Classification Search
CPC .. H01J 37/00; H01J 37/02; H01J 37/26; H01J 37/261; H01J 37/265; H01J 37/285; H01J 37/28; H01J 2237/2626; H01J 2237/2852
(Continued)

(56) References Cited

U.S. PATENT DOCUMENTS

2014/0306121 A1* 10/2014 Ward ............... H01J 37/08
250/424

OTHER PUBLICATIONS

Herschitz, Roman, et al., "A quantitative atom-probe field-ion microscope study of the compositions of dilute Co(Nb) and Co(Fe) alloys", Surface Science, Jul. 2, 1983, pp. 63-88, vol. 130, No. 1, North-Holland Publishing Company, NL.
(Continued)

*Primary Examiner* — Jason L McCormack
(74) *Attorney, Agent, or Firm* — BakerHostetler

(57) ABSTRACT

A method for imaging a material to atomic scale by means of a field-ion microscope having a vacuum chamber configured to accommodate the material prepared in the form of a tip and an imaging gas, and an ion detector is provided. The method includes application of a DC electrical potential (VDC) and of a pulsed electrical potential, of which the maximum pulse value is denoted Vimp, so that the tip erodes for a potential value equal to VDC+Vimp; acquisition, by the detector between at least two pulses of the pulsed potential, of series of at least two ion images of the impacts of the ions repelled by the tip onto the detector; and calculation of a quantity characteristic of a trend of the erosion of the tip based on the series of ion images acquired
(Continued)

and the adjustment, between each series of images, of the values of VDC and of Vimp such that the quantity characteristic of the trend and the ratio VDC/Vimp remain constant.

11 Claims, 2 Drawing Sheets

(58) Field of Classification Search
USPC .............................. 250/306, 307, 309, 492.1
See application file for complete search history.

(56) References Cited

OTHER PUBLICATIONS

Hono, Kazuhiro, et al., "A study of multi-layer G.P. zones in an Al-1.7 at. %Cu alloy by atom-probe FIM", Scripta Metallurgica, Apr. 1, 1986, pp. 487-492, vol. 20, No. 4, Pergamon Press, GB.

International Searching Authority, Internlinational Search Report (ISR) and Written Opinion received for International Application No. PCT/EP2020/054508, dated Aug. 3, 2020, 12 pages, European Patent Office, Netherlands.

Jang, Ho, et al., "Atomic scale observations of the chemical composition of a metal/ceramic interface", Scripta Metallurgica et Materialia, May 1, 1992, pp. 1493-1498, vol. 26, No. 9, Pergamon Press, GB.

Katnagallu, Shyam, et al., "Impact of local electrostatic field rearrangement on field ionization", Journal of Physics D: Applied Physics, Feb. 19, 2018, vol. 51, issue 10, No. 105601, 10 pages, Institute of Physics Publishing Ltd, GB.

National Industrial Property Institute, Preliminary Search Report and Written Opinion received for Application No. FR1902139, dated Dec. 20, 2019, 7 pages, Republic of France.

Vurpillot, Francois, et al., "True Atomic-Scale Imaging in Three Dimensions: A Review of the Rebirth of Field-Ion Microscopy", Microscopy and Microanalysis, Mar. 24, 2017, pp. 210-220, vol. 23, No. 2, Microscopy Society of America, US.

* cited by examiner

[Fig. 1]
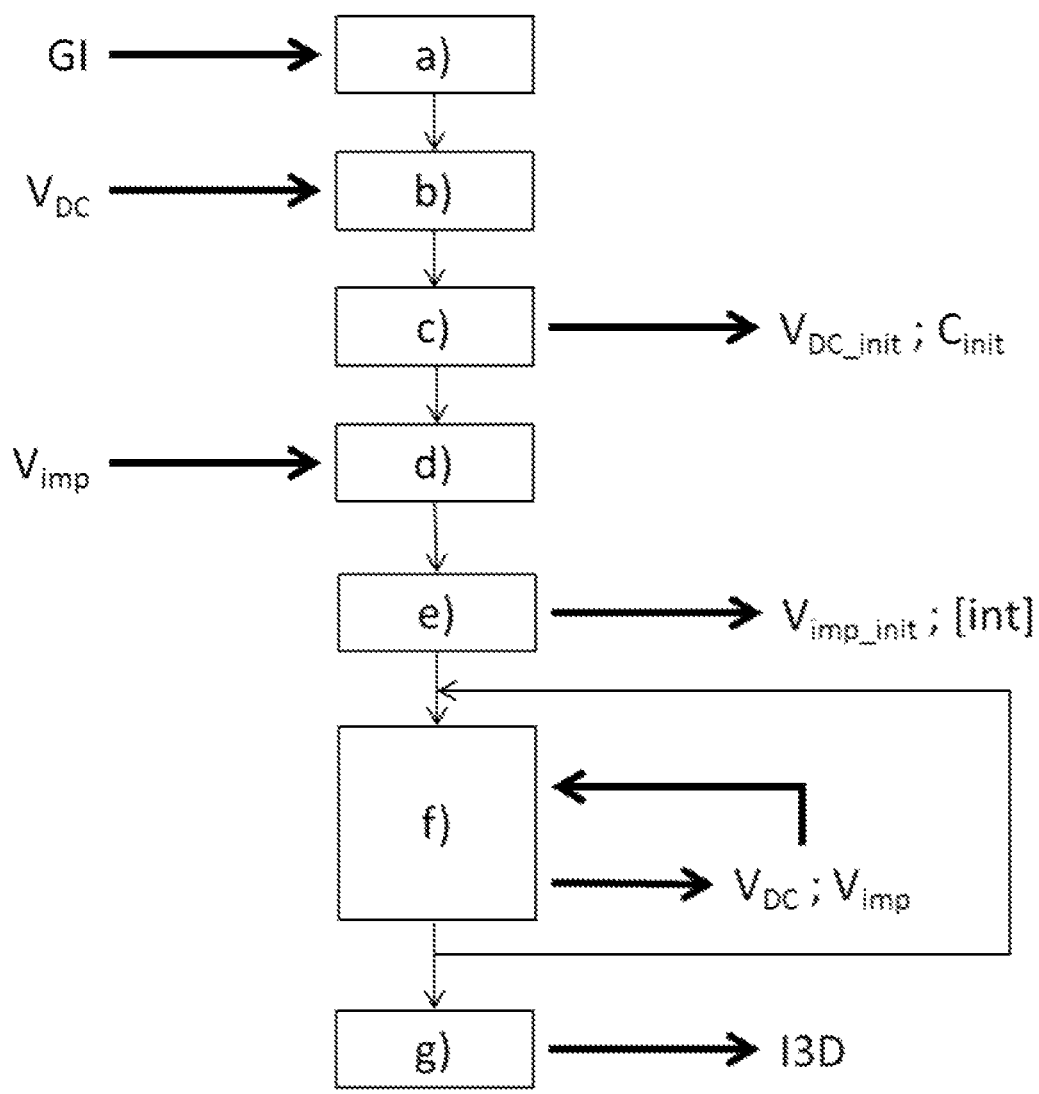

[Fig. 2]
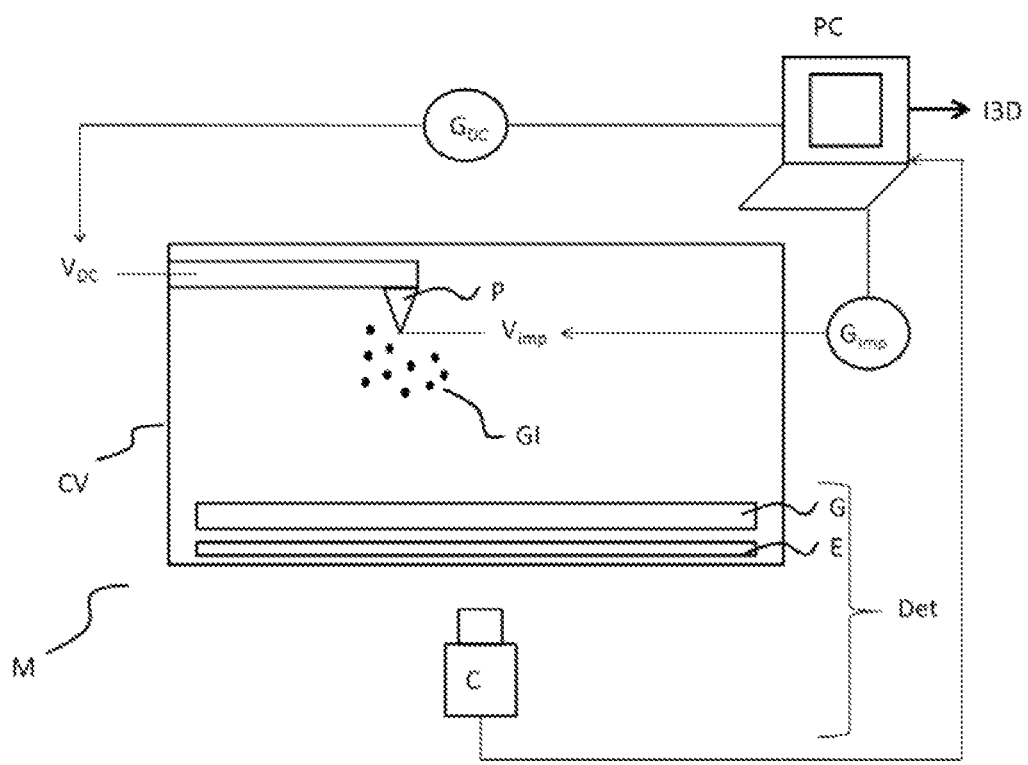

AUTOMATED TOMOGRAPHY FIELD ION MICROSCOPE

CROSS-REFERENCE TO RELATED APPLICATIONS

This application is a national phase entry of PCT/EP2020/054508, filed on Feb. 20, 2020, which claims the benefit of priority of French Patent Application No. 1902139, filed on Mar. 1, 2019, the contents of which being hereby incorporated by reference in their entirety for all purposes.

FIELD

The present invention relates to a method for imaging a material to atomic scale and a field-ion microscope.

BACKGROUND

The field-ion microscope is an instrument that was invented in the 1950s. This instrument exhibits good performance levels for observing structural material defects, but it remains little used. Its main drawback is the difficulty in controlling the optimal imaging parameters during the acquisition of thousands of images of a material. It is then difficult to effectively identify the objects of interest during the course of the analysis. The variation of the quality of the images notably prevents an extraction and a correct reconstruction of the three-dimensional information.

Traditionally, the material to be analyzed is prepared in the form of a fine needle of small radius of curvature (less than 200 nm) and placed in a vacuum chamber. A gas, called imaging gas, is introduced into the vacuum chamber and the ambient pressure of this gas, in the chamber, is low (lower than 0.1 Pa). An intense DC potential (for example 20 kV) is applied to the tip of the needle, which has the effect of creating an intense electrical field (greater than 20 V/nm) at the tip of the needle and of ionizing the imaging gas above the surface atoms of the tip. The ions formed are then repelled from the surface of the tip by the intense electrical field, and their points of impact, for example on a screen, are detected. Since the distribution of the electrical field is known, the trajectory of the repelled ions and their point of departure can be deduced therefrom, which makes it possible to reconstruct the atomic surface of the tip.

In order to obtain a usable sub-nanometric scale resolution image of the surface atoms imaged by the gas, the value of the DC potential can be made to vary. The potential that makes it possible to obtain this optimal image is called "best image potential". This potential depends both on the nature of the imaging gas used and on the radius of curvature of the tip.

It is also possible to study the internal atomic structure of the material constituting the tip. For that, in addition to the DC potential, a pulsed potential is applied to the tip. This has the effect of eroding the end of the tip, that is to say that atoms of the surface of the tip will be repelled or evaporated from the tip. The potential that allows this evaporation is called "evaporation potential".

The imaging gas therefore continues to ionize on the surface of the eroded tip, which makes it possible to reconstruct the internal atomic structure of the material constituting the tip.

Nevertheless, the erosion of the tip has the effect of modifying the radius of curvature of the tip. Therefore the quality of the images of the surface atoms degrades over time. Furthermore, depending on the pulsed potential value applied, either too few atoms evaporate, and in this case, the analysis of the internal structure of the material risks being very costly in time; or a great number of atoms evaporate from the tip, and in this case, it is difficult to know if only one atomic plane has evaporated or if several planes have evaporated. The article by Vurpillot et al., entitled "True atomic-scale imaging in three dimensions: a review of the rebirth of field-ion microscopy" and published in Microsc. Microanal. in 2017 proposes applying a constant DC potential of 7 kV to have an evaporation DC electrical field on the surface of the tip at the start of the analysis. The erosion of the tip is then continuous and is performed with a speed of 0.5 nm/s. The three-dimensional reconstruction of the structure of the material is done by tracking each atom over all acquired images of the tip during the erosion. However, the atoms are not all visible on the images with the same resolution, since the potential applied is not always the best image potential, but a potential of uncontrolled value, which makes the tracking of certain atoms difficult.

BRIEF SUMMARY

The invention aims to remedy the abovementioned drawbacks of the prior art, and more particularly it aims to propose a method for imaging a material to atomic scale by means of a field-ion microscope that makes it possible to obtain images of the same quality for each atom throughout the duration of the erosion of the tip.

One subject of the invention is therefore a method for imaging a material to atomic scale by means of a field-ion microscope comprising a vacuum chamber configured to accommodate the material prepared in the form of a tip and an imaging gas, and an ion detector, characterized in that it comprises the application of a DC electrical potential and of a pulsed electrical potential, of which the maximum pulse value is denoted Vimp, so that the tip erodes for a potential value equal to VDC+Vimp; the acquisition, by the detector between at least two pulses of the pulsed potential, of series of at least two ion images of the impacts of the ions repelled by the tip onto the detector; the calculation of a quantity characteristic of a trend of the erosion of the tip based on the series of ion images acquired and the adjustment, between each series of images, of the values of VDC and of Vimp such that the quantity characteristic of the trend and the ratio VDC/Vimp remain constant.

According to embodiments of the invention:
the imaging gas is a gas that has a pressure lower than 0.1 Pa;
the imaging gas is chosen from among neon, helium, hydrogen, argon or a mixture comprising at least one of these gases; and
the quantity characteristic of the trend of the erosion is chosen from among: a speed of erosion of the tip, a rate of evaporation of the atoms of the tip or a number of atoms evaporated from the tip.

According to one embodiment of the invention, the imaging method comprises the following steps:
a) introduction of an imaging gas into the vacuum chamber;
b) application of a DC electrical potential to the tip so as to create an electrical potential difference with respect to the walls of the vacuum chamber in order for the imaging gas to ionize on a surface of the tip and for the ions thus formed by the imaging gas to be repelled from the surface of the tip and migrate toward the ion detector by potential difference effect;
c) acquisition, by the detector, of ion images of the impacts of the ions repelled by the tip onto the detector for different DC electrical potential values, calculation of a first quantity characteristic of a quality of the ion images for each image acquired, selection of the ion image that has a desired image quality and definition of an initialization DC potential value, denoted VDC_init, and of a target value of this first quantity, denoted Cinit, VDC_init and Cinit being the DC electrical potential and the first quantity of the selected image;

d) application of the DC electrical potential at the value VDC_init and application of a pulsed electrical potential, a pulse maximum of which is denoted Vimp, to the end of the tip so as to provoke an erosion of the tip during a pulse;

e) acquisition, between at least two pulses of the pulsed potential, by the detector, of ion images of the impacts of the ions repelled from the eroded tip onto the detector for different values of the maximum of the pulse Vimp, calculation of a second quantity characteristic of a trend of the erosion of the tip for pairs of images acquired during this step for one and the same value of Vimp, selection of the pair that has the desired erosion trend, definition of a target maximum value of the pulse of the pulsed electrical potential, called initialization pulse and denoted Vimp_init, corresponding to the maximum pulse value of the pulsed electrical potential of the selected pair and definition of a target interval around the value of the second quantity of the pair selected in step e);

f) acquisition, by the detector, by iterations and during the application of the DC electrical potential and of the pulsed electrical potential, of series of ion images of the impacts of the ions repelled by the tip onto the detector between at least two pulses of the pulsed potential, each series comprising at least two images and, on each iteration, calculation of the second quantity characteristic of the trend of the erosion of the tip from the series acquired on this iteration, then comparison of this calculated second quantity with limits of the target interval defined in step e), and adjustment of the DC electrical potential value applied and of the maximum of the pulse of the pulsed electrical potential (Vimp) applied such that, for the next iteration, the values of the second quantity characteristic of the trend of the erosion lie within the target interval and the ratio VDC/Vimp remains constant, for the first iteration, the value of the DC potential is equal to VDC_init and the maximum of the pulse of the pulsed potential is equal to Vimp_init.

Step f) is reiterated until the stop condition is satisfied.

According to other embodiments of the invention:

the method comprises a step g) of reconstruction of a three-dimensional image to atomic scale of the material constituting the tip from the series of ion images acquired in step f);

the first quantity characteristic of the quality of the ion images is chosen from among: a resolution of the ion images or a contrast of the ion images;

step f) comprises, during each iteration, the production of a differential image obtained by subtraction of two successive ion images from one and the same series; and the stop condition is chosen from among: the reaching of a maximum potential, a manual stop by a user or even a break of the tip.

Another subject of the invention is a field-ion microscope for implementing the method according to the invention, comprising:

a vacuum chamber configured to receive a sample of a material in the form of a tip and to receive a gas;

an ion detector, configured so as to form ion images of impacts of ions and to acquire ion images of these impacts;

a DC potential generator configured to apply a DC electrical potential VDC to the tip;

a pulsed potential generator configured to apply a pulsed electrical potential of which the maximum value of the pulse is Vimp;

an electronic system configured to receive and process the ion images acquired by the detector, and to adjust the potential values VDC and Vimp so that a speed of erosion of the tip remains constant and the ratio VDC/Vimp remains constant and to control the DC potential and pulsed potential generators.

According to another embodiment, the detector comprises a camera, wafers of microchannels and a phosphorescent screen, the wafers being placed facing the tip in the vacuum chamber, the screen being placed parallel behind the wafers in the vacuum chamber and the camera being placed facing the screen outside the vacuum chamber.

BRIEF DESCRIPTION OF THE SEVERAL VIEWS OF THE DRAWING(S)

Other features, details and advantages of the invention will become apparent on reading the description given with reference to the attached figures which are given by way of example and which represent, respectively:

FIG. 1, a diagram of the steps of the imaging method according to the invention, and FIG. 2, an ion microscope allowing the method according to the invention to be implemented.

FIG. 1 represents a diagram of the steps of the imaging method according to an embodiment of the invention. The method makes it possible to analyze the internal crystalline structure of a material. This material must be prepared in the form of a tip of which the apex has a radius of curvature of less than 200 nm. This tip is placed in the vacuum chamber of a field-ion microscope also comprising an ion detector.

DETAILED DESCRIPTION

The first step of the method (step a)) consists in introducing an imaging gas GI into the vacuum chamber of the microscope. This imaging gas GI is at low pressure in the vacuum chamber and can be chosen from among neon, helium, hydrogen, argon or another gas at a pressure lower than 0.1 Pa ($10^{-4}$ mbar).

In the second step of the method (step b)), a DC electrical potential VDC is applied to the tip so as to create an electrical potential difference with respect to the walls of the vacuum chamber. This potential difference has the effect of provoking the ionization of the imaging gas GI above the atoms of the surface of the tip. Again by potential difference effect, the ions thus formed by the image gas GI will be repelled from the surface of the tip and migrate toward the ion detector.

In step c), ion images of the impacts of the ions, deriving from the ionization of the imaging gas GI and repelled by the tip onto the detector for different DC electrical potential VDC values, are acquired by virtue of the ion detector. Each atom of the surface of the tip is the source of an ion beam. Then, in this step, a first quantity characteristic of the quality of the ion images is calculated for each image acquired. The calculated quantity is, for example, the resolution of the image or the contrast of the image.

Then, the ion image exhibiting the desired image quality is selected and VDC_init and Cinit are thus defined. VDC_init is the DC electrical potential value of the selected image and Cinit is the value of the calculated first quantity of the selected image. The potential value VDC_init is thus the best image potential value which makes it possible to obtain a clear image of the atoms on the surface of the tip during the ionization of the imaging gas GI until the tip has begun to erode. Below this value, certain zones of the tip are not visible, because no ionization of the gas occurs, whereas, above this value, the ionization of the gas GI no longer takes place on the surface of the tip and the image of the tip then becomes fuzzy.

In the next step (step d)), the DC electrical potential at the value VDC_init and a pulsed electrical potential, the maximum pulse value of which is denoted Vimp are applied to the end of the tip. The maximum value of the pulsed potential (at the moment of the pulse) is Vimp and its minimum value is 0 V. These two potentials make it possible to provoke the erosion of the tip during a pulse. The pulses are of very short duration (from 0.1 ns to 100 ns) and are reproduced at a rate of from a few hertz to a few hundreds of kilohertz. The erosion (or the evaporation of the atoms) of the tip occurs primarily on the maximum of the pulse Vimp. Between the pulses, the rate of erosion is very low, because it is much less than one atom per second. Hereinbelow, it will be considered that a rate of evaporation expresses the number of atoms which evaporate per unit of time, whereas a rate of erosion expresses the reduction of a characteristic dimension of the tip per unit of time.

During this step, a second quantity characteristic of the trend of the erosion of the tip is also calculated. It is for example possible to calculate the rate of erosion of the tip, or the speed of erosion of the tip or even the number of atoms evaporated. That can be done, for example:

- by locally measuring the frequency of variation of light intensity, which makes it possible to obtain the speed of evaporation of certain atom planes, or
- more directly, by counting the number of atoms imaged on each image, or
- by directly calculating the difference in the number of atoms present between two images of a pair of images acquired at the same VDC+Vimp value.

The pair of ion images that have a desired trend of erosion, that is to say that having a rate of erosion desired by the user, is then selected: for example, that which exhibits a rate of erosion of 100 atoms per second is selected, or that in which 50 atoms are evaporated is selected, etc. Everything depends on the desired precision of the analysis of the material by the user. If a precise analysis of the structure of the material is desired, the user will tend to want a slow trend of erosion, therefore a speed and a rate of evaporation that are low, whereas, if a rapid and non-precise analysis of the material is desired, a higher rate of erosion and rate of evaporation will be accepted.

From the selected pair, Vimp_init, which is the maximum value of the pulse of the pulsed potential of the selected image or pair of images, is then defined. From this value Vimp_init, the factor $\alpha$=Vimp_init/VDC_init, which will be constant during analysis, is defined. Also defined is a target interval [int] which is an interval centered around the value of the second quantity characteristic of the trend of the erosion of the selected image or pair of images. For example, if the selected image quantity is a rate of evaporation at 100 atoms per second, the target interval [int] can be defined as the interval [50 atoms/s; 150 atoms/s]. $\alpha$ defines the fraction of pulsed electrical potential for the chosen target interval.

Steps b) to e) of the method make it possible to initialize the method.

The next step (step f)) is a step by iterations. On each iteration, a DC electrical potential and a pulsed electrical potential are applied. Then, between at least two pulses of the pulsed potential and on each iteration, a series of ion images of the impacts of the ions repelled by the eroded tip onto the detector is acquired, the quantity characteristic of the trend of the erosion is then calculated and it is compared to the limits of the target interval [int]. The value of the DC electrical potential and the maximum of the pulsed electrical potential are then adjusted such that the values of the second quantity characteristic of the trend of the erosion measured on the next iteration lie within the target interval [int] and the ratio VDC/Vimp remains constant, that is to say that Vimp remains equal to VDC/a on the next iteration with a tolerance of a few percentage points, for example 5% or less, preferably 1% or less.

For example, if the second quantity lies within the interval with a tolerance of a few percentage points, for example 5% or less, preferably 1% or less, the values of Vimp and of VDC are retained from the iteration n for the next iteration n+1, otherwise they are modified for the iteration n+1. In particular, if the calculated quantity is lower than the lower limit of the target interval [int], then VDC and Vimp are increased, and if it is above the upper limit of the target interval [int], then VDC and Vimp are reduced.

For the first iteration, the value of VDC applied is VDC_init and the value of Vimp is Vimp_init.

Step g) is reiterated when a stop condition is satisfied. This stop condition can be the reaching of a maximum potential (for example when VDC reaches 15 kV), a manual stop by the user or even the breaking of the sample being analyzed.

These adjustments of the values of VDC and Vimp between each iteration are necessary to maintain the same image quality between each series of images and a constant erosion. In fact, the radius of curvature of the tip increases as the erosion of the tip progresses, therefore the best image potential value varies, so it is necessary to modify VDC to maintain images of the same quality and above all of good quality. By modifying VDC, the total potential is modified, as is the electrical field around the tip, so it is also necessary to modify Vimp to maintain the same trend of the erosion of the tip, that is to say the same speed of erosion or the same rate of erosion as the iterations progress.

Then the next step (step h)) is the reconstruction of a three-dimensional image I3D of the atom structure of the material constituting the tip from the series of images acquired in the iterative step g).

Step g) can also comprise, during each iteration, the production of a differential image obtained by subtraction of two successive images from one and the same series. That notably makes it possible to calculate the number of atoms evaporated between two images.

[FIG. 2] represents an ion microscope according to the invention that makes it possible to implement the method according to the invention.

This field-ion microscope M comprises a vacuum chamber CV, an ion detector Det, a DC potential generator GDC and a pulsed potential generator Gimp. The vacuum chamber CV is configured to receive a sample of a material prepared in the form of a tip P and to receive a gas GI. The microscope M also comprises a computing system PC.

The ion detector Det is configured so as to form images from the impacts of ions generated by the surface of the tip and to acquire ion images of these impacts. The detector Det comprises wafers of microchannels G that make it possible to transform an ion impact into an electron shower and a phosphorescent screen E which transforms the electron shower into a light spot. The detector Det also comprises a camera C which acquires images of the spots visible on the screen E. The camera C sends these images to the computing system PC which will process them.

The wafers of microchannels G are placed facing the tip P in the vacuum chamber CV and the screen E is placed parallel behind the wafers G in the vacuum chamber CV. The camera C is placed facing the screen E outside the vacuum chamber CV.

If it is not desired to place the camera C facing the screen E, for reasons of bulk for example, it can be offset with respect to the screen and a mirror can be used between the two.

The DC potential generator GDC is configured so as to apply a DC electrical potential VDC to the tip P. This generator GDC is controlled by the computing system PC.

The pulsed potential generator Gimp is configured so as to apply a pulsed electrical potential Vimp to the end of the tip P.

The generators Gimp and GDC can be two distinct generators, as represented in the figure. It is also possible to have a single generator capable of delivering a pulsed electrical potential of which the maximum value (at the moment of the pulse) is VDC+Vimp and of which the minimum value is VDC.

The computing system PC is configured to receive and process the ion images acquired by the detector Det, in particular by the camera C. It is also configured to calculate a quantity characteristic of the quality of the ion images acquired, such as, for example, the resolution or the contrast of the image. It is configured to calculate a quantity characteristic of the trend of the erosion, so it can thus calculate the speed of erosion of the tip and/or the rate of evaporation of the tip and/or the number of atoms evaporated. It is also configured to calculate the adjustment of the values of the DC potential (VDC) and of the maximum of the pulse of the pulsed potential (Vimp) and to control the DC potential (GDC) and pulsed potential (Gimp) generators.

According to another embodiment of the invention, the computing system PC is also configured to reconstruct a three-dimensional image I3D of the structure of the material constituting the tip from the different ion images acquired by the detector Det.

According to another embodiment of the invention, the computing system PC is configured to produce a differential image deriving from the subtraction of two ion images.

According to another embodiment of the invention, the computing system PC is configured to apply an algorithm for detecting light spots on the ion images and/or on a differential image.

According to another embodiment, the ion detector D comprises wafers of microchannels and an electron shower spatial location system of resistive anode or delay line type.

According to another embodiment, the ion detector Det comprises a charge-couple sensor (CCD) or a "complementary metal oxide semiconductor" (CMOS) sensor placed directly facing the tip. In this case, the detector can also comprise an amplifier.

The invention claimed is:

1. A method for imaging a material to atomic scale by means of a field-ion microscope comprising a vacuum chamber configured to accommodate the material prepared in the form of a tip and an imaging gas, and an ion detector, the method comprising application of a DC electrical potential (VDC) and a pulsed electrical potential, of which the maximum pulse value is denoted Vimp, so that the tip erodes for a potential value equal to VDC+Vimp; acquisition, by the detector between at least two pulses of the pulsed potential, of series of at least two ion images of the impacts of the ions repelled by the tip onto the detector; and calculation of a quantity characteristic of a trend of the erosion of the tip based on the series of ion images acquired and the adjustment, between each series of images, of the values of VDC and of Vimp such that the quantity characteristic of the trend and the ratio VDC/Vimp remain constant.

2. The imaging method as claimed in claim 1, wherein the imaging gas is a gas having a pressure lower than 0.1 Pa.

3. The imaging method as claimed in claim 1, wherein the imaging gas is chosen from among neon, helium, hydrogen, argon, or a mixture comprising at least one of these gases.

4. The imaging method as claimed in claim 1, wherein the quantity characteristic of the trend of the erosion is chosen from among: a speed of erosion of the tip, a rate of evaporation of the atoms of the tip, or a number of atoms evaporated from the tip.

5. The imaging method as claimed in claim 1, comprising the following steps:
   a) introduction of an imaging gas into the vacuum chamber;
   b) application of a DC electrical potential (VDC) to the tip so as to create an electrical potential difference with respect to the walls of the vacuum chamber in order for the imaging gas to ionize on a surface of the tip and for the ions thus formed by the imaging gas to be repelled from the surface of the tip and migrate toward the ion detector by potential difference effect;
   c) acquisition, by the detector, of ion images of the impacts of the ions repelled by the tip onto the detector for different DC electrical potential (VDC) values, calculation of a first quantity characteristic of a quality of the ion images for each image acquired, selection of the ion image that has a desired image quality and definition of an initialization DC potential value, denoted VDC_init and of a target value of this first quantity, denoted Cinit, VDC_init and Cinit being the DC electrical potential and the first quantity of the selected image;
   d) application of the DC electrical potential at the value VDC_init and application of a pulsed electrical potential, a pulse maximum of which is denoted Vimp, to the end of the tip so as to provoke an erosion of the tip during a pulse;
   e) acquisition between at least two pulses of the pulsed potential, by the detector, of ion images of the impacts of the ions repelled from the eroded tip onto the detector for different values of the maximum of the pulse Vimp, calculation of a second quantity characteristic of a trend of the erosion of the tip for pairs of images acquired during this step for one and the same value of Vimp, selection of the pair that has the desired erosion trend, definition of a target maximum value of the pulse of the pulsed electrical potential, called initialization pulse and denoted Vimp_init, corresponding to the maximum pulse value of the pulsed electrical potential of the selected pair and definition of a target interval around the value of the second quantity of the pair selected in step e); and
   f) acquisition, by the detector, by iterations and during the application of the DC electrical potential and of the pulsed electrical potential, of series of ion images of the impacts of the ions repelled by the tip onto the detector between at least two pulses of the pulsed potential, each series comprising at least two images and, on each iteration, calculation of the second quantity characteristic of the trend of the erosion of the tip from the series acquired on this iteration, then comparison of this second calculated quantity with limits of the target interval defined in step e), and adjustment of the DC electrical potential (VDC) value applied and of the maximum of the pulse of the pulsed electrical potential (Vimp) applied such that, for the next iteration, the values of the second quantity characteristic of the trend of the erosion lie within the target interval and the ratio VDC/Vimp remains constant, for the first iteration, the value of the DC potential is equal to VDC_init and the maximum of the pulse of the pulsed potential is equal to Vimp_init;

wherein step f) is reiterated until a stop condition is satisfied.

6. The imaging method as claimed in claim 5, comprising a step g) of reconstruction of a three-dimensional image to atomic scale of the material constituting the tip from the series of ion images acquired in step f).

7. The imaging method as claimed in claim 5, wherein the first quantity characteristic of the quality of the ion images is chosen from among: a resolution of the ion images or a contrast of the ion images.

8. The imaging method as claimed in claim 5, wherein step f) comprises, during each iteration, the production of a differential image obtained by subtraction of two successive ion images from one and the same series.

9. The imaging method as claimed in claim 5, wherein the stop condition is chosen from among: the reaching of a maximum potential, a manual stop by a user or even a break of the tip.

10. A field-ion microscope for implementing the method as claimed in claim 1, comprising:

a vacuum chamber configured to receive a sample of a material in the form of a tip and to receive a gas;

an ion detector, configured so as to form ion images of impacts of ions and to acquire ion images of these impacts;

a DC potential generator configured to apply a DC electrical potential (VDC) to the tip;

a pulsed potential generator configured to apply a pulsed electrical potential of which the maximum value of the pulse is Vimp; and an electronic system configured to receive and process the ion images acquired by the detector, and to adjust the potential values VDC and Vimp so that a speed of erosion of the tip remains constant and the ratio VDC/Vimp remains constant and to control the DC potential and pulsed potential generators.

11. The microscope as claimed in claim 10, wherein the detector comprises a camera, wafers of microchannels, and a phosphorescent screen, the wafers being placed facing the tip in the vacuum chamber, the screen being placed parallel behind the wafers in the vacuum chamber, and the camera being placed facing the screen outside the vacuum chamber.

* * * * *